United States Patent
Tang et al.

(10) Patent No.: US 12,176,333 B2
(45) Date of Patent: Dec. 24, 2024

(54) BACKPLANE AND METHOD FOR MANUFACTURING THE SAME, BACKLIGHT MODULE, AND DISPLAY APPARATUS

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Hai Tang, Beijing (CN); Xiaolin Geng, Beijing (CN); Liang Gao, Beijing (CN); Shubai Zhang, Beijing (CN); Jianwei Qin, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,848

(22) PCT Filed: Jun. 24, 2021

(86) PCT No.: PCT/CN2021/102192
§ 371 (c)(1),
(2) Date: Jun. 29, 2022

(87) PCT Pub. No.: WO2022/266960
PCT Pub. Date: Dec. 29, 2022

(65) Prior Publication Data
US 2024/0178205 A1     May 30, 2024

(51) Int. Cl.
*H01L 25/00*     (2006.01)
*G02F 1/13357*     (2006.01)
*H01L 25/16*     (2023.01)

(52) U.S. Cl.
CPC ...... *H01L 25/167* (2013.01); *G02F 1/133603* (2013.01); *G02F 1/133605* (2013.01)

(58) Field of Classification Search
CPC .............. H01L 25/167; H01L 21/4846; H01L 23/5386
See application file for complete search history.

(56) References Cited

U.S. PATENT DOCUMENTS 6,091,139 A    7/2000    Adachi et al.
9,704,940 B2   7/2017    Amano
(Continued)

FOREIGN PATENT DOCUMENTS

| CN | 207425918 U | 5/2018 |
| CN | 109411457 A | 3/2019 |

(Continued)

OTHER PUBLICATIONS

Extended European Search Report for corresponding EP Application No. 21946456.7, dated Nov. 30, 2023, 10 pages.

*Primary Examiner* — Gerald J Sufleta, II
(74) *Attorney, Agent, or Firm* — Dority & Manning, P.A.

(57) ABSTRACT

A backplane includes a substrate, a circuit structure layer, a reflective layer, a plurality of electronic devices and a plurality of encapsulation portions. Each encapsulation portion covers an electronic device in the plurality of electronic devices. At least one first conductive line includes a first linear extending portion, a second linear extending portion and a third linear extending portion that are sequentially connected. Orthographic projections of the first linear extending portion, the second linear extending portion, the third linear extending portion and an encapsulation portion in the plurality of encapsulation portions on the substrate are respectively a first orthographic projection, a second orthographic projection, a third orthographic projection and a fourth orthographic projection. The first orthographic projection is located within the fourth orthographic projection, (Continued)

the second orthographic projection is partially overlapped with the fourth orthographic projection, and the third orthographic projection is located outside the fourth orthographic projection.

20 Claims, 10 Drawing Sheets

(56) References Cited

U.S. PATENT DOCUMENTS

| | | |
|---|---|---|
| 2007/0189007 A1 | 8/2007 | Nishimoto et al. |
| 2008/0054287 A1 | 3/2008 | Oshio et al. |
| 2009/0145647 A1 | 6/2009 | Tanaka et al. |
| 2016/0268365 A1 | 9/2016 | Amano |
| 2017/0220167 A1 | 8/2017 | Oohira |
| 2020/0335482 A1 | 10/2020 | Mladenovski et al. |
| 2021/0050497 A1* | 2/2021 | Li ..................... H01L 25/0753 |
| 2021/0126171 A1* | 4/2021 | Chen ..................... H01L 33/54 |
| 2021/0167246 A1* | 6/2021 | Choy ..................... G03B 21/204 |
| 2021/0183897 A1* | 6/2021 | Qi ..................... H01L 27/1288 |
| 2022/0093690 A1* | 3/2022 | Wang ..................... H10K 59/50 |
| 2024/0234434 A1* | 7/2024 | Lei ..................... H01L 27/124 |

FOREIGN PATENT DOCUMENTS

| | | |
|---|---|---|
| CN | 111867245 A | 10/2020 |
| JP | 2008244151 A | 10/2008 |
| JP | 2011077116 A | 4/2011 |
| KR | 20120119396 A | 10/2012 |

\* cited by examiner

BACKPLANE AND METHOD FOR MANUFACTURING THE SAME, BACKLIGHT MODULE, AND DISPLAY APPARATUS

CROSS-REFERENCE TO RELATED APPLICATION

This application is a national phase entry under 35 USC 371 of International Patent Application No. PCT/CN 2021/102192 filed on Jun. 24, 2021, which is incorporated herein by reference in its entirety.

TECHNICAL FIELD

The present disclosure relates to the field of display technologies, and in particular, to a backplane and a method for manufacturing the same, a backlight module, and a display apparatus.

BACKGROUND

Mini light-emitting diodes (Mini LEDs) have self-luminous display characteristics, and have the advantages of full solid state, long service life, high brightness, low power consumption, small size and ultra-high resolution. However, in a Mini LED product, peeling of an encapsulation portion is easy to occur when the temperature changes, and the Mini LED is turned off due to serious peeling of the encapsulation portion.

SUMMARY

In an aspect, a backplane is provided. The backplane includes a substrate, a circuit structure layer located on a side of the substrate, a reflective layer located on a side of the circuit structure layer away from the substrate, a plurality of electronic devices and a plurality of encapsulation portions. The reflective layer includes a plurality of first through holes arranged at intervals. Each electronic device is located in a first through hole in the plurality of first through holes, and the plurality of electronic devices are electrically connected to the circuit structure layer. Each encapsulation portion covers an electronic device in the plurality of electronic devices. A conductive layer in the circuit structure layer farthest from the substrate includes a plurality of first conductive lines, and at least one first conductive line includes a first linear extending portion, a second linear extending portion and a third linear extending portion that are sequentially connected. An orthographic projection of the first linear extending portion on the substrate is a first orthographic projection, an orthographic projection of the second linear extending portion on the substrate is a second orthographic projection, an orthographic projection of the third linear extending portion on the substrate is a third orthographic projection, and an orthographic projection of an encapsulation portion in the plurality of encapsulation portions on the substrate is a fourth orthographic projection. The first orthographic projection is located within the fourth orthographic projection, the second orthographic projection is partially overlapped with the fourth orthographic projection, and the third orthographic projection is located outside the fourth orthographic projection. Two endpoints of the fourth orthographic projection that are farthest from each other in a width direction of the second linear extending portion are first endpoints. A distance between the second orthographic projection and each of first reference lines, which respectively pass through the first endpoints and are parallel to the second linear extending portion, is not less than half of a line width of the second linear extending portion.

In some embodiments, the distance between the second orthographic projection and each of the first reference lines, which respectively pass through the first endpoints and are parallel to the second linear extending portion, is greater than or equal to 0.15 mm.

In some embodiments, two endpoints of the fourth orthographic projection that are farthest from each other in a width direction of the first linear extending portion are second endpoints. A distance between the first orthographic projection and each of second reference lines, which respectively pass through the second endpoints and are parallel to the first linear extending portion, is not less than half of a line width of the first linear extending portion.

In some embodiments, the distance between the first orthographic projection and each of the second reference lines, which respectively pass through the second endpoints and are parallel to the first linear extending portion, is greater than or equal to 0.15 mm.

In some embodiments, a minimum distance between the third orthographic projection and the fourth orthographic projection is not less than half of a line width of the third linear extending portion.

In some embodiments, the minimum distance between the third orthographic projection and the fourth orthographic projection is greater than or equal to 0.15 mm.

In some embodiments, the at least one first conductive line further includes a first connection portion connecting the first linear extending portion and the second linear extending portion, and a second connection portion connecting the second linear extending portion and the third linear extending portion. An orthographic projection of the first connection portion on the substrate is located within the fourth orthographic projection, and an orthographic projection of the second connection portion on the substrate is located outside the fourth orthographic projection.

In some embodiments, an extending direction of the first linear extending portion is perpendicular to an extending direction of the second linear extending portion; and/or the extending direction of the second linear extending portion is perpendicular to an extending direction of the third linear extending portion.

In some embodiments, a minimum distance between the orthographic projection of the first connection portion on the substrate and the fourth orthographic projection is greater than or equal to 0.25 mm; and/or a minimum distance between the orthographic projection of the second connection portion on the substrate and the fourth orthographic projection is greater than or equal to 0.25 mm.

In some embodiments, a shape of the fourth orthographic projection is a circle or substantially a circle. A radius of the circle is greater than or equal to 1.25 mm, or is less than or equal to 1.0 mm.

In some embodiments, a line width of the first linear extending portion is less than or equal to 0.2 mm. The line width of the second linear extending portion is less than or equal to 0.2 mm. A line width of the third linear extending portion is less than or equal to 0.2 mm.

In some embodiments, the backplate further includes a plurality of reflective portions. Each reflective portion covers an edge of the first through hole, and the reflective portion defines a second through hole in the first through hole. The electronic device located in the first through hole is located in the second through hole.

In some embodiments, the plurality of electronic devices include at least one light-emitting device and at least one driver chip.

In some embodiments, the circuit structure layer includes two conductive layers. A conductive layer in the two conductive layers away from the substrate is a first conductive layer, and another conductive layer in the two conductive layers proximate to the substrate is a second conductive layer. The first conductive layer includes the plurality of first conductive lines. The second conductive layer includes a plurality of second conductive lines. The circuit structure layer further includes a first insulating layer located between the first conductive layer and the second conductive layer, and a first transition layer located between the second conductive layer and the first insulating layer.

In some embodiments, the backplane further includes a second transition layer, a second insulating layer and a third transition layer. The second transition layer is located between the substrate and the second conductive layer. The second insulating layer is located between the first conductive layer and the reflective layer. The third transition layer is located between the first conductive layer and the second insulating layer.

In another aspect, a backlight module is provided. The backlight module includes the backplane in any one of the above embodiments, and the plurality of electronic devices in the backplane include a plurality of light-emitting devices.

In some embodiments, the backlight module further includes a diffusion plate, a quantum dot film, a diffusion sheet, a composite film and a plurality of support pillars. The diffusion plate is located on a light-emitting side of the backplane. The quantum dot film is located on a side of the diffusion plate away from the backplane. The diffusion sheet is located on a side of the quantum dot film away from the diffusion plate. The composite film is located on a side of the diffusion sheet away from the quantum dot film. The plurality of support pillars are located between the backplane and the diffusion plate.

In yet another aspect, a display apparatus is provided. The display apparatus includes the backlight module in any one of the above embodiments, and a liquid crystal display panel located on a light exit side of the backlight module.

In yet another aspect, a display apparatus is provided. The display apparatus includes a display substrate, and the display substrate is the backplane in any one of the above embodiments. The plurality of electronic devices in the backplane include a plurality of light-emitting devices.

In yet another aspect, a method for manufacturing a backplane is provided. The method for manufacturing the backplane includes: providing a substrate; forming a circuit structure layer on a side of the substrate; forming a reflective layer on a side of the circuit structure layer away from the substrate, the reflective layer including a plurality of first through holes arranged at intervals; mounting a plurality of electronic devices in the plurality of first through holes, respectively, each electronic device being located in a first through hole in the plurality of first through holes, and the plurality of electronic devices being electrically connected to the circuit structure layer; and forming a plurality of encapsulation portions on a side of the plurality of electronic devices away from the substrate, each encapsulation portion covering an electronic device in the plurality of electronic devices. A conductive layer in the circuit structure layer farthest from the substrate includes a plurality of first conductive lines, and at least one first conductive line includes a first linear extending portion, a second linear extending portion and a third linear extending portion that are sequentially connected. An orthographic projection of the first linear extending portion on the substrate is a first orthographic projection, an orthographic projection of the second linear extending portion on the substrate is a second orthographic projection, an orthographic projection of the third linear extending portion on the substrate is a third orthographic projection, and an orthographic projection of an encapsulation portion in the plurality of encapsulation portions on the substrate is a fourth orthographic projection. The first orthographic projection is located within the fourth orthographic projection, the second orthographic projection is partially overlapped with the fourth orthographic projection, and the third orthographic projection is located outside the fourth orthographic projection. Two endpoints of the fourth orthographic projection that are farthest from each other in a width direction of the second linear extending portion are first endpoints. A distance between the second orthographic projection and each of first reference lines, which respectively pass through the first endpoints and are parallel to the second linear extending portion, is not less than half of a line width of the second linear extending portion.

In some embodiments, after forming the reflective layer on the side of the circuit structure layer away from the substrate, the method for manufacturing the backplane further includes: forming a plurality of reflective portions on a side of the reflective layer away from the substrate. Each reflective portion covers an edge of the first through hole, and the reflective portion defines a second through hole in the first through hole. The electronic device located in the first through hole is located in the second through hole.

In some embodiments, forming the circuit structure layer on the side of the substrate, includes: forming a second conductive layer on the side of the substrate, the second conductive layer including a plurality of second conductive lines; forming a first transition layer on a side of the second conductive layer away from the substrate; forming a first insulating layer on a side of the first transition layer away from the second conductive layer; and forming a first conductive layer on a side of the first insulating layer away from the first transition layer, the first conductive layer including the plurality of first conductive lines.

In some embodiments, before forming the second conductive layer on the side of the substrate, the method for manufacturing the backplane further includes: forming a second transition layer on the side of the substrate. Before forming the reflective layer on the side of the circuit structure layer away from the substrate, the method for manufacturing the backplane further includes: forming a third transition layer on a side of the first conductive layer away from the first insulating layer; and forming a second insulating layer on a side of the third transition layer away from the first conductive layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
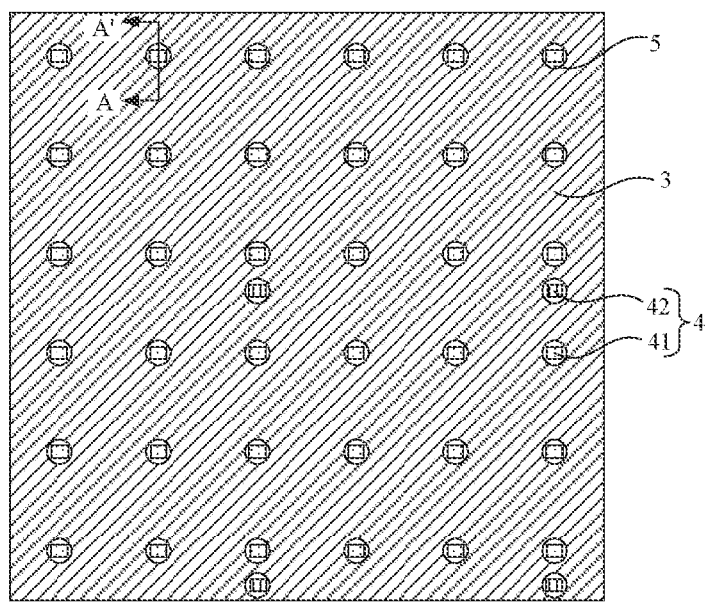
FIG. 1 is a top view of a backplane, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is optionally construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

As used herein, the term such as "about" or "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system). Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 2:
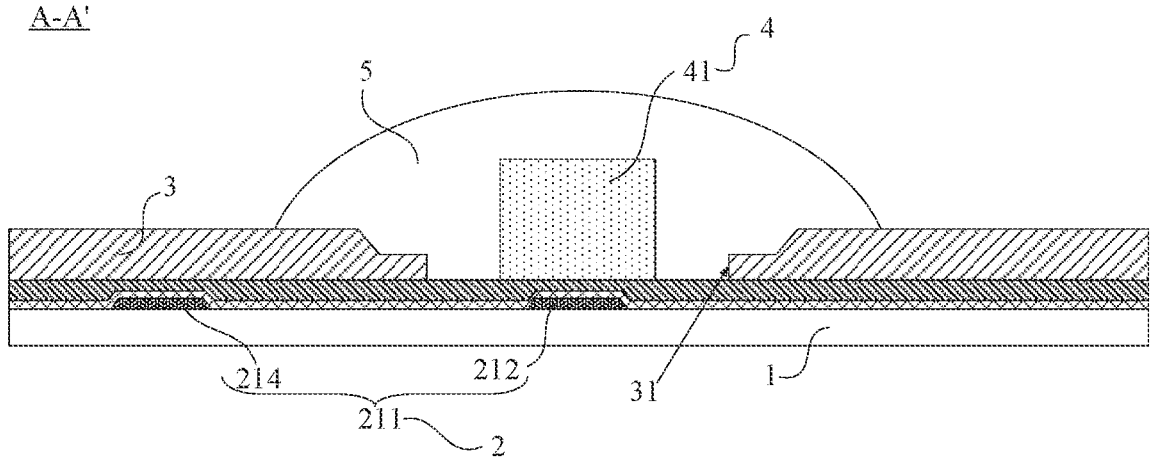
FIG. 2 is a sectional view of the backplane in FIG. 1 taken along the A-A' direction, in accordance with some embodiments.
Figure 3:
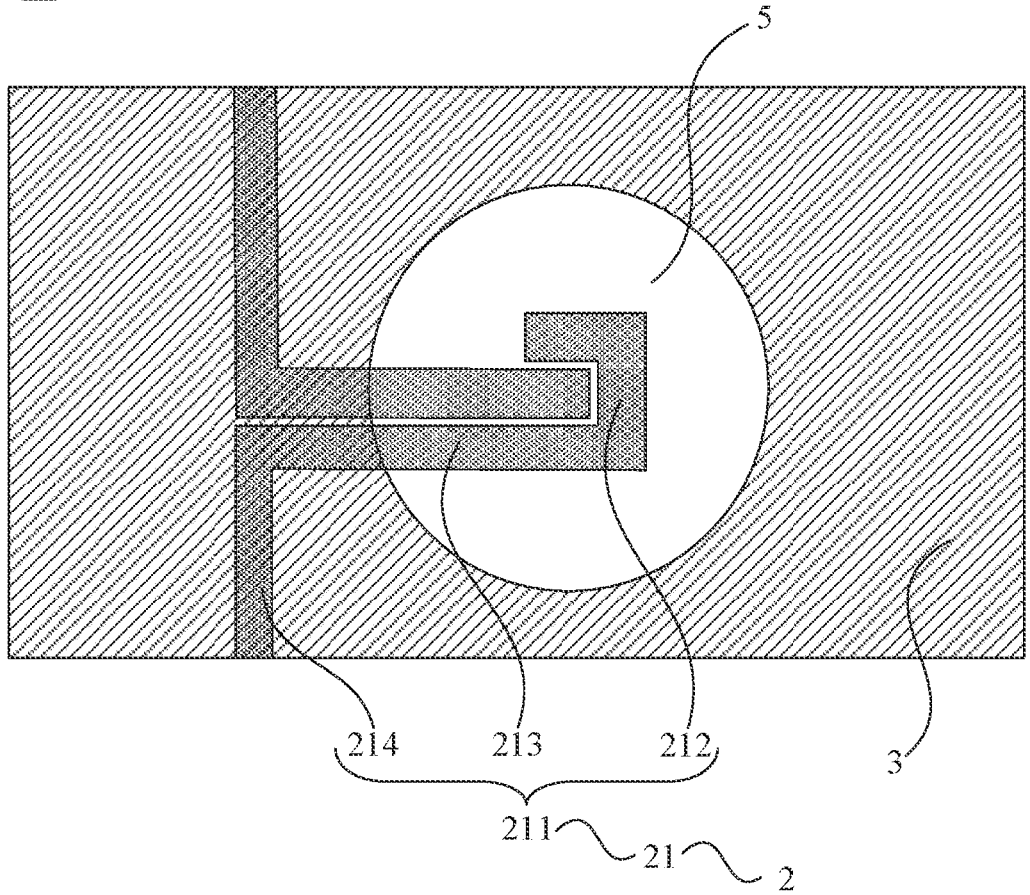
FIG. 3 is a top view of another backplane, in accordance with some embodiments.

Referring to FIGS. 1, 2 and 3, some embodiments of the present disclosure provide a backplane 10. The backplane 10 includes a substrate 1, a circuit structure layer 2, a reflective layer 3, a plurality of electronic devices 4 and a plurality of encapsulation portions 5. The circuit structure layer 2 is located on a side of the substrate 1. The reflective layer 3 is located on a side of the circuit structure layer 2 away from the substrate 1, and the reflective layer 3 includes a plurality of first through holes 31 arranged at intervals. Each electronic device 4 is located in a first through hole 31, and the plurality of electronic devices 4 are all electrically connected to the circuit structure layer 2. Each encapsulation portion 5 covers an electronic device 4.

As shown in FIG. 3, a conductive layer 21 in the circuit structure layer 2 farthest from the substrate 1 includes a plurality of first conductive lines 211. At least one first conductive line 211 includes a first linear extending portion 212, a second linear extending portion 213 and a third linear extending portion 214 that are sequentially connected.

Figure 4:
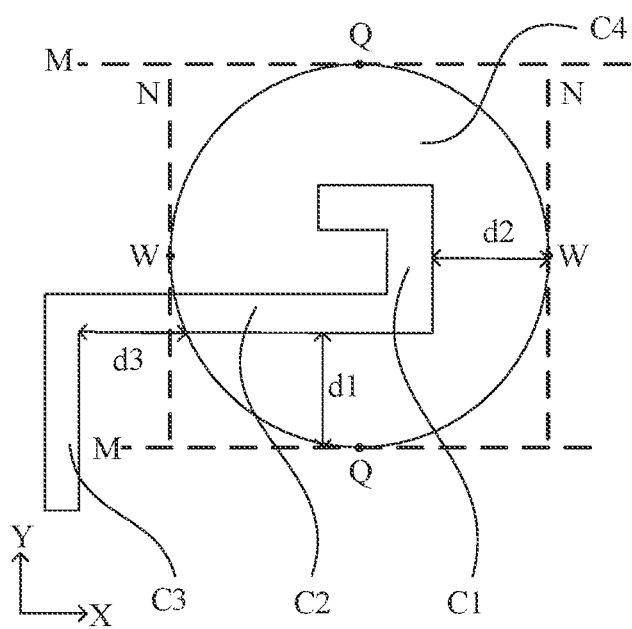
FIG. 4 is a diagram showing a positional relationship between an orthographic projection of a first conductive line and an orthographic projection of an encapsulation portion, in accordance with some embodiments.

As shown in FIG. 4, an orthographic projection of the first linear extending portion 212 on the substrate is a first orthographic projection C1, an orthographic projection of the second linear extending portion 213 on the substrate 1 is a second orthographic projection C2, an orthographic projection of the third linear extending portion 214 on the substrate 1 is a third orthographic projection C3, and an orthographic projection of the encapsulation portion 5 on the substrate 1 is a fourth orthographic projection C4. The first orthographic projection C1 is located within the fourth orthographic projection C4, the second orthographic projection C2 is partially overlapped with the fourth orthographic projection C4, and the third orthographic projection C3 is located outside the fourth orthographic projection C4.

Two endpoints of the fourth orthographic projection C4 that are farthest from each other in a width direction Y of the second linear extending portion 213 are first endpoints Q. A distance d1 between the second orthographic projection C2 and each of first reference lines M, which respectively pass through the first endpoints Q and are parallel to the second linear extending portion 213, is not less than half of a line width of the second linear extending portion 213.

For example, the substrate 1 is made of glass.

The reflective layer 3 is used for reflecting light incident on a surface of the reflective layer 3 away from the circuit structure layer 2, so as to improve a light utilization rate of the backplane 10.

In some examples, the reflective layer 3 may be made of white ink, and a reflectivity of the white ink to light is about 90%. In this way, the reflective layer 3 is able to reflect more light, thereby achieving a better light utilization effect.

In some other examples, the reflective layer 3 may be a reflective sheet, and the reflective sheet may be adhered to the side of the circuit structure layer 2 away from the substrate 1. A reflectivity of the reflective sheet to light is about 98%. In this way, most of the light incident on the reflective layer 3 may be reflected to a greater extent, thereby increasing an amount of light emitted from the backplane 10.

Figure 5:
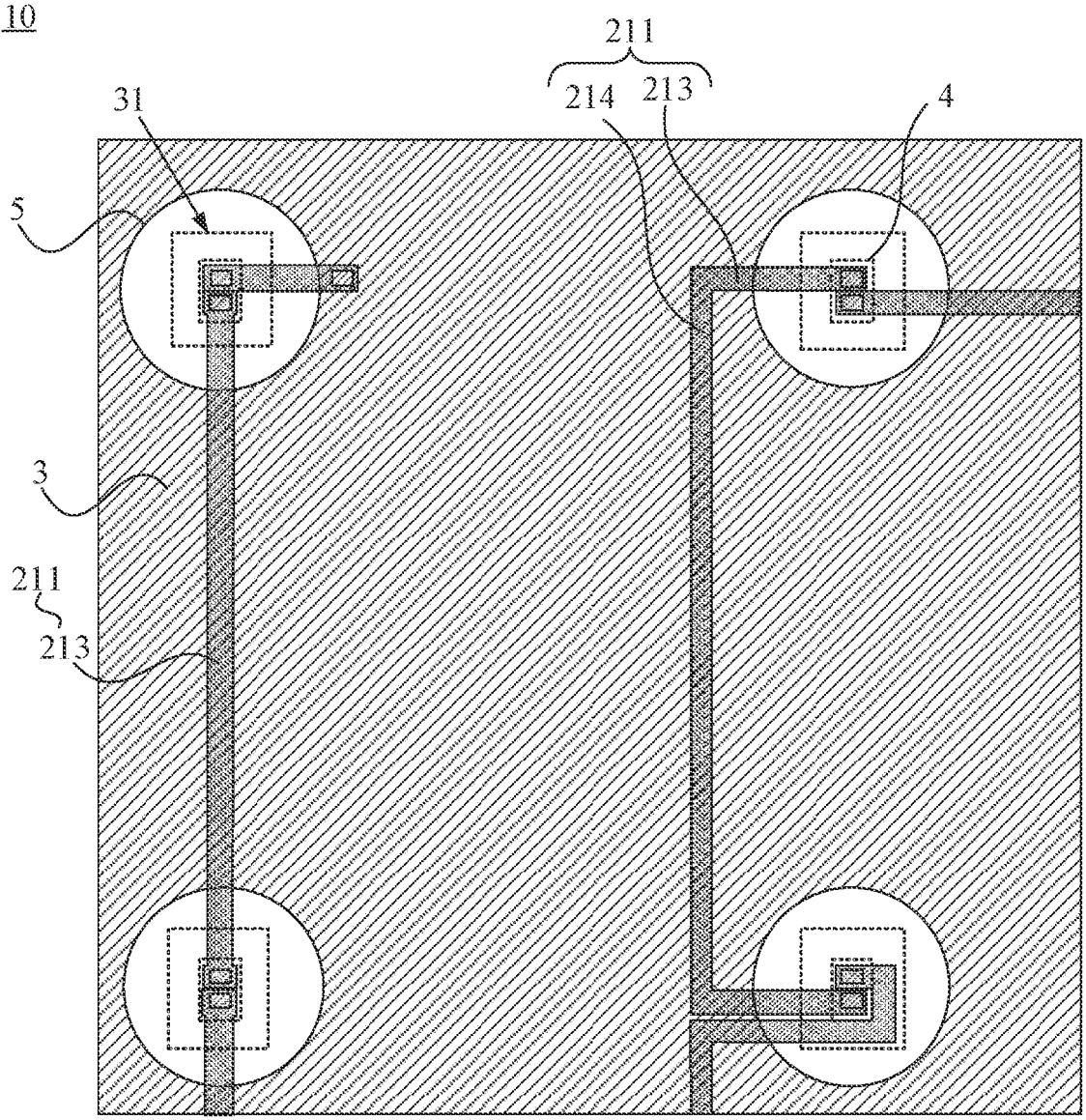
FIG. 5 is a top view of yet another backplane, in accordance with some embodiments.

The reflective layer 3 includes the plurality of first through holes 31 arranged at intervals. For example, an orthogonal projection of the first through hole 31 on the substrate 1 may be in a rectangular shape or substantially in a rectangular shape (as shown in FIG. 5). Alternatively, for example, an orthographic projection of the first through hole 31 on the substrate 1 may be in a circular shape or substantially in a circular shape. The shape of the first through hole 31 is not limited thereto, as long as the electronic device 4 is able to be placed in the first through hole 31. In addition, the number of the first through holes 31 is not limited.

In some embodiments, as shown in FIG. 1, the plurality of electronic devices 4 may include at least one light-emitting device 41 and at least one driver chip 42.

The plurality of electronic devices 4 may include a single light-emitting device 41 and a single driver chip 42. Alternatively, the plurality of electronic devices 4 may include a plurality of light-emitting devices 41 and a plurality of driver chips 42. The number of the driver chip(s) 42 and the number of the light-emitting device(s) 41 are not limited, as long as the backplane 10 is able to emit light normally.

For example, in a case where the plurality of electronic devices 4 include the plurality of light-emitting devices 41 and the plurality of driver chips 42, the plurality of light-emitting devices 41 may be arranged in an array in the backplane 10. The plurality of driver chips 42 may also be arranged in an array in the backplane 10.

For example, the light-emitting device 41 may be a mini light-emitting diode. The driver chip 42 may be configured to control light-emitting state(s) of at least one light-emitting device 41, e.g., to control whether the at least one light-emitting device 41 emits light or not. For example, a driver chip 42 may control light-emitting states of four light-emitting devices 41. Alternatively, for example, as shown in FIG. 1, a driver chip 42 may control light-emitting states of nine light-emitting devices 41. The number of light-emitting devices 41 controlled by a driver chip 42 is not limited, as long as the backplane 10 is able to emit light normally.

For example, the encapsulation portion 5 may be made of silica gel. The encapsulation portion 5 is used for protecting the electronic device 4. For example, the encapsulation portion 5 may prevent water vapor from entering the electronic device 4, prevent the electronic device 4 from being collided with other components of the backplane 10, and prevent the electronic device 4 from being corroded.

It will be noted that the plurality of first conductive lines 211 included in the conductive layer 21 in the circuit structure layer 2 farthest from the substrate 1 may not all include the first linear extending portion 212, the second linear extending portion 213 and the third linear extending portion 214. For example, as shown in FIG. 5, part of the plurality of first conductive lines 211 each may include only second linear extending portion(s) 213 and a third linear extending portion 214, and part of the plurality of first conductive lines 211 each may include only a second linear extending portion 213.

The distance d1 between the second orthographic projection C2 and each of the first reference lines M, which respectively pass through the first endpoints Q and are parallel to the second linear extending portion 213, is not less than half of the line width of the second linear extending portion 213. For example, in a case where the line width of the second linear extending portion 213 is 0.3 mm, the distance between the second orthographic projection C2 and each of the first reference lines M, which respectively pass through the first endpoints Q and are parallel to the second linear extending portion 213, is not less than 0.15 mm.

Since a region of the backplane 10 where the first conductive line 211 is disposed has weak film adhesion, in some embodiments of the present disclosure, the orthographic projection (i.e., the first orthographic projection C1) of the first linear extending portion 212 on the substrate 1 is located within the orthographic projection (i.e., the fourth orthographic projection C4) of the encapsulation portion 5 on the substrate 1, so that an orthographic projection of an edge of the encapsulation portion 5 on the substrate 1 may be non-overlapped with the orthographic projection of the first linear extending portion 212 on the substrate 1. In this way, in a case where a stress concentration region occurs at a position corresponding to the edge of the encapsulation portion 5 in the backplane 10 due to different materials and different expansion coefficients of the encapsulation portion 5, the reflective layer 3 and the circuit structure layer 2 when the ambient temperature changes, the stress concentration region does not coincide with a region where the first linear extending portion 212 is located. That is, the stress concentration region is non-overlapped with a region having weak film adhesion.

Thus, in the region where the first linear extending portion is located, peeling of the encapsulation portion, chapping of the reflective layer, and breakage of the first linear extending portion are avoided, so that a problem that the electronic device 4 in the backplane 10 cannot operate normally due to breakage of the first conductive line 211 is solved. Therefore, an ability of the backplane 10 to resist cold and hot shock is effectively improved, a use stability of the backplane 10 is enhanced, and a service life of the backplane 10 is prolonged.

Moreover, in some embodiments of the present disclosure, the distance d1 between the orthographic projection of the second linear extending portion 213 on the substrate 1 and each of the first reference lines M, which respectively pass through the first endpoints Q and are parallel to the second linear extending portion 213, is not less than half of the line width of the second linear extending portion 213. Therefore, the encapsulation portion 5 covers not only a partial region where the second linear extending portion 213 is located, but also partial regions respectively located on two sides of the second linear extending portion 213 in the width direction Y of the second linear extending portion 213.

Since regions respectively located on the two sides of the second linear extending portion 213 in the width direction of the second linear extending portion 213 each have strong film adhesion, when the ambient temperature changes, the stress concentration region at the position corresponding to the edge of the encapsulation portion 5 in the backplane 10 is overlapped with the regions each having strong film adhesion, and the film adhesion is able to be offset with a shrinkage force of the encapsulation portion 5. Therefore, the risks of the peeling of the encapsulation portion 5, the chapping of the reflective layer, and breakage of the second linear extending portion 213 are effectively reduced, so that the problem that the electronic device 4 in the backplane 10 cannot operate normally due to the breakage of the first conductive line 211 may be further solved. Therefore, the ability of the backplane 10 to resist the cold and hot shock is effectively improved, the use stability of the backplane 10 is enhanced, and the service life of the backplane 10 is prolonged.

Moreover, in some embodiments of the present disclosure, the orthographic projection (i.e., the third orthographic projection C3) of the third linear extending portion 214 on the substrate 1 is located outside the orthographic projection (i.e., the fourth orthographic projection C4) of the encapsulation portion 5 on the substrate 1, so that the orthographic projection of the edge of the encapsulation portion 5 on the substrate 1 is non-overlapped with the orthographic projection of the third linear extending portion 214 on the substrate 1.

In this way, in the case where the stress concentration region occurs at the position corresponding to the edge of the encapsulation portion 5 in the backplane 10 due to different materials and different expansion coefficients of the encapsulation portion 5, the reflective layer 3 and the circuit structure layer 2 when the ambient temperature changes, the stress concentration region does not coincide with a region where the third linear extending portion 214 is located. That is, the stress concentration region is non-overlapped with a region having weak film adhesion.

Thus, in the region where the third linear extending portion is located, the peeling of the encapsulation portion, the chapping of the reflective layer, and breakage of the third linear extending portion are avoided, so that the problem that the electronic device 4 in the backplane 10 cannot operate normally due to the breakage of the first conductive line 211 is solved. Therefore, the ability of the backplane 10 to resist the cold and hot shock is effectively improved, the use stability of the backplane 10 is enhanced, and the service life of the backplane 10 is prolonged.

Figure 6:
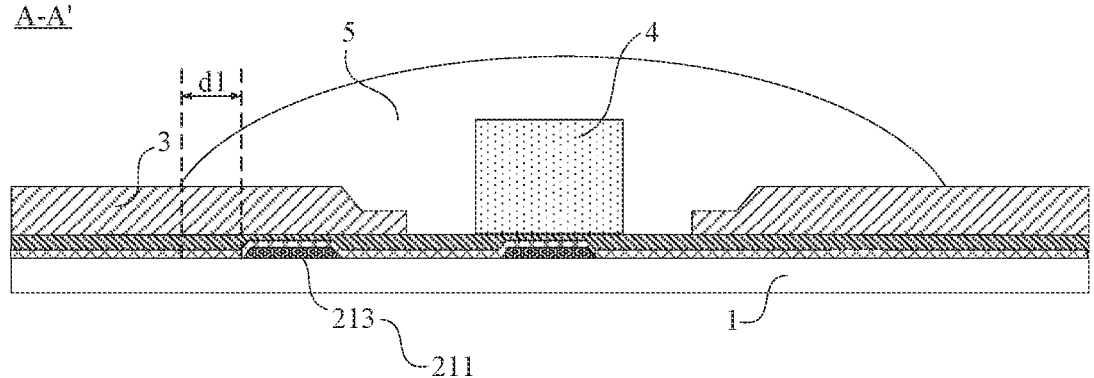
FIG. 6 is another sectional view of the backplane in FIG. 1 taken along the A-A' direction, in accordance with some embodiments.

In some embodiments, referring to FIGS. 4 and 6, the distance d1 between the second orthographic projection C2 and each of the first reference lines M, which respectively pass through the first endpoints Q and are parallel to the second linear extending portion 213, is greater than or equal to 0.15 mm.

For example, the distance d1 between the second orthographic projection C2 and each of the first reference lines M, which respectively pass through the first endpoints Q and are parallel to the second linear extending portion 213, may be 0.15 mm, 0.16 mm, 0.17 mm, or 0.20 mm.

In this way, the second orthographic projection C2 is far away from the first endpoints Q, so that the regions respectively located on the two sides of the second linear extending portion 213 each have a large area covered by the encapsulation portion 5. Therefore, the encapsulation portion 5 has a large region overlapped with the region having strong film adhesion in the backplane 10, and the region where the film adhesion is offset with the shrinkage force of the encapsulation portion 5 is large, so that the peeling of the encapsulation portion 5, the chapping of the reflective layer, and the breakage of the second linear extending portion 213 are less likely to occur in the backplane 10. Thus, the problem that the electronic device 4 in the backplane 10 cannot operate normally due to the breakage of the first conductive line is further solved, so that the ability of the backplane 10 to resist the cold and hot shock is effectively improved, the use stability of the backplane 10 is enhanced, and the service life of the backplane 10 is prolonged.

Based on this, the line width of the second linear extending portion 213 may be appropriately increased, so as to reduce the resistance of the second linear extending portion 213 and the power consumption of the second linear extending portion 213, thereby reducing the power consumption of the first conductive line 211.

Figure 7:
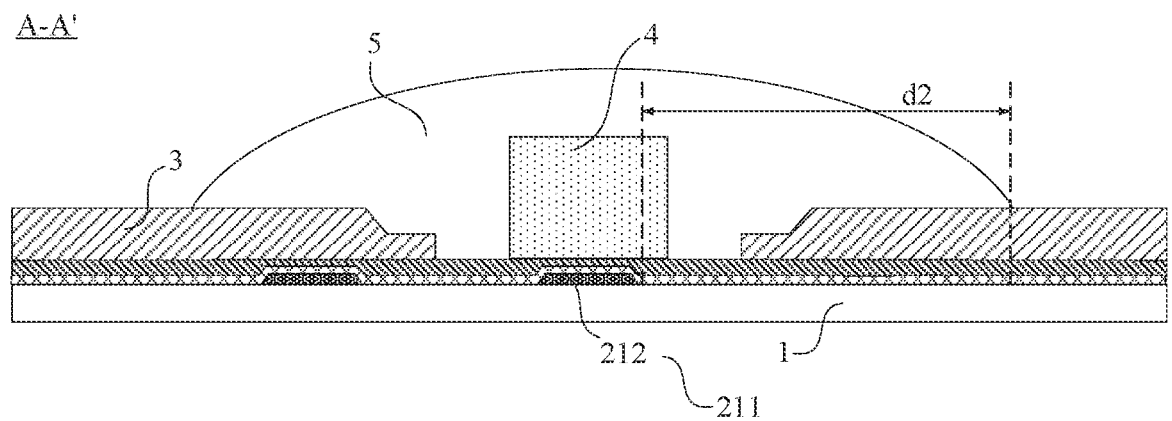
FIG. 7 is yet another sectional view of the backplane in FIG. 1 taken along the A-A' direction, in accordance with some embodiments.

In some embodiments, referring to FIGS. 4 and 7, two endpoints of the fourth orthographic projection C4 that are farthest from each other in a width direction X of the first linear extending portion 212 are second endpoints W. A distance d2 between the first orthographic projection C1 and each of second reference lines N, which respectively pass through the second endpoints W and are parallel to the first linear extending portion 212, is not less than half of a line width of the first linear extending portion 212.

For example, in a case where the line width of the first linear extending portion 212 is 0.35 mm, the distance d2 between the first orthographic projection C1 and each the second reference lines N, which respectively pass through the second endpoints W and are parallel to the first linear extending portion 212, may be 0.18 mm.

In this way, the encapsulation portion 5 covers not only the region where the first linear extending portion 212 is located, but also partial regions respectively located on two sides of the first linear extending portion 212.

Since regions respectively located on the two sides of the first linear extending portion 212 each have strong film adhesion, when the ambient temperature changes, the stress concentration region at the position corresponding to the edge of the encapsulation portion 5 in the backplane 10 is overlapped with the regions each having strong film adhesion, and the film adhesion is able to be offset with the shrinkage force of the encapsulation portion 5. Therefore, the risks of the peeling of the encapsulation portion 5, the chapping of the reflective layer, and the breakage of the first linear extending portion 212 are effectively reduced, so that the problem that the electronic device 4 in the backplane 10 cannot operate normally due to the breakage of the first conductive line 211 may be further solved. Therefore, the ability of the backplane 10 to resist the cold and hot shock is effectively improved, the use stability of the backplane 10 is enhanced, and the service life of the backplane 10 is prolonged.

In some embodiments, as shown in FIGS. 4 and 7, the distance between the first orthographic projection C1 and each of the second reference lines N, which respectively pass through the second endpoints W and are parallel to the first linear extending portion 212, is greater than or equal to 0.15 mm.

For example, the distance d2 between the first orthographic projection C1 and each of the second reference lines N, which respectively pass through the second endpoints W and are parallel to the first linear extending portion 212, may be 0.15 mm, 0.16 mm, 0.17 mm, or 0.20 mm.

In this way, the first orthographic projection C1 is far away from the second endpoints W, so that the regions respectively located on the two sides of the first linear extending portion 212 each have a large area covered by the encapsulation portion 5. Therefore, the encapsulation portion 5 has a large region overlapped with the region having strong film adhesion in the backplane 10, and the region where the film adhesion is offset with the shrinkage force of the encapsulation portion 5 is large, so that the peeling of the encapsulation portion 5, the chapping of the reflective layer, and the breakage of the first linear extending portion 212 are less likely to occur in the backplane 10. Thus, the problem that the electronic device 4 in the backplane 10 cannot operate normally due to the breakage of the first conductive line is further solved, so that the ability of the backplane 10 to resist the cold and hot shock is effectively improved, the use stability of the backplane 10 is enhanced, and the service life of the backplane 10 is prolonged.

Based on this, the line width of the first linear extending portion 212 may be appropriately increased, so as to reduce the resistance of the first linear extending portion 212 and the power consumption of the first linear extending portion 212, thereby reducing the power consumption of the first conductive line 211.

Figure 8:
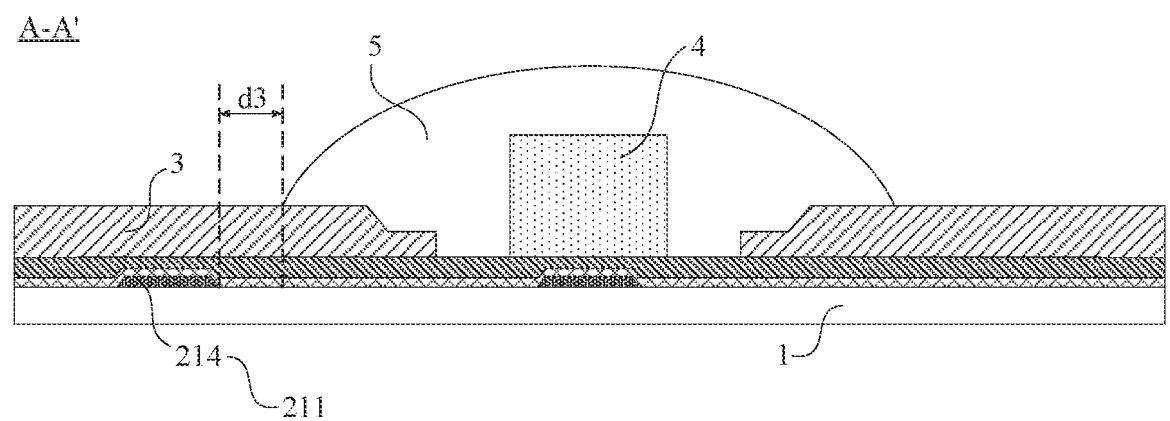
FIG. 8 is yet another sectional view of the backplane in FIG. 1 taken along the A-A' direction, in accordance with some embodiments.

In some embodiments, referring to FIGS. 4 and 8, a minimum distance d3 between the third orthographic projection C3 and the fourth orthographic projection C4 is not less than half of a line width of the third linear extending portion 214.

For example, in a case where the line width of the third linear extending portion 214 is 0.3 mm, the minimum distance d3 between the third orthographic projection C3 and the fourth orthographic projection C4 is not less than 0.15 mm.

In this way, the third linear extending portion 214 is far away from the edge of the encapsulation portion 5, and when the ambient temperature changes, the stress concentration region does not coincide with a region having weak film adhesion. Therefore, the peeling of the encapsulation portion 5, the chapping of the reflective layer 3, and the breakage of the third linear extending portion 214 caused by the force are further avoided, so that the problem that the electronic device 4 in the backplane 10 cannot operate normally due to the breakage of the first conductive line is solved. Therefore, the ability of the backplane 10 to resist the cold and hot shock is effectively improved, the use stability of the backplane 10 is enhanced, and the service life of the backplane 10 is prolonged.

In some embodiments, as shown in FIGS. 4 and 8, the minimum distance d3 between the third orthographic projection C3 and the fourth orthographic projection C4 is greater than or equal to 0.15 mm.

For example, the minimum distance d3 between the third orthographic projection C3 and the fourth orthographic projection C4 may be 0.15 mm, 0.16 mm, 0.17 mm, or 0.20 mm.

In this way, the third linear extending portion 214 is far away from the edge of the encapsulation portion 5, and when the ambient temperature changes, the stress concentration region does not coincide with a region having weak film adhesion. Therefore, the peeling of the encapsulation portion 5, the chapping of the reflective layer 3, and the breakage of the third linear extending portion 214 caused by the force are further avoided, so that the problem that the electronic device 4 in the backplane 10 cannot operate normally due to the breakage of the first conductive line is solved. Therefore, the ability of the backplane 10 to resist the cold and hot shock is effectively improved, the use stability of the backplane 10 is enhanced, and the service life of the backplane 10 is prolonged.

Based on this, the line width of the third linear extending portion 214 may be increased, so as to reduce the resistance of the third linear extending portion 214 and the power consumption of the third linear extending portion 214, thereby reducing the power consumption of the first conductive line 211.

Figure 9:
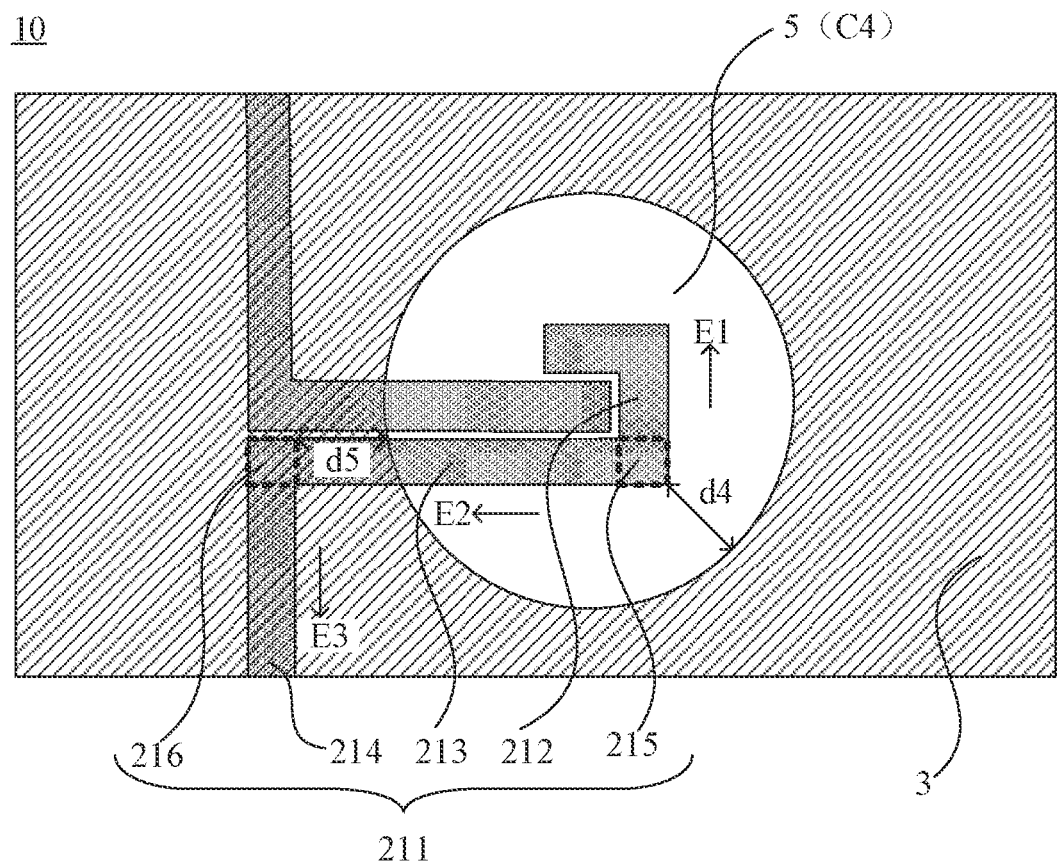
FIG. 9 is a top view of yet another backplane, in accordance with some embodiments.

In some embodiments, as shown in FIG. 9, the at least one first conductive line 211 further includes a first connection portion 215 connecting the first linear extending portion 212 and the second linear extending portion 213, and a second connection portion 216 connecting the second linear extending portion 213 and the third linear extending portion 214. An orthographic projection of the first connection portion 215 on the substrate 1 is located within the fourth orthographic projection C4, and an orthographic projection of the second connection portion 216 on the substrate 1 is located outside the fourth orthographic projection C4.

In this way, when the ambient temperature changes (e.g., the temperature drops), the stress concentration region at the position corresponding to the edge of the encapsulation portion 5 in the backplane 10 does not coincide with a region where the first connection portion 215 is located and a region where the second connection portion 216 is located. That is, the shrinkage force of the encapsulation portion 5 does not directly act on the region where the first connection portion 215 is located and the region where the second connection portion 216 is located. Thus, in the region where the first connection portion is located and the region where the second connection portion is located, the peeling of the encapsulation portion and the chapping of the reflective layer due to a fact that the region where the first connection portion is located and the region where the second connection portion is located each have weak film adhesion are avoided, and thus the problem that the electronic device 4 in the backplane 10 cannot operate normally when the temperature changes is solved. Therefore, the ability of the backplane 10 to resist the cold and hot shock is effectively improved, the use stability of the backplane 10 is enhanced, and the service life of the backplane 10 is prolonged.

In some embodiments, as shown in FIG. 9, an extending direction E1 of the first linear extending portion 212 is perpendicular to an extending direction E2 of the second linear extending portion 213.

In some other embodiments, as shown in FIG. 9, the extending direction E2 of the second linear extending portion 213 is perpendicular to an extending direction E3 of the third linear extending portion 214.

In yet some other embodiments, as shown in FIG. 9, the extending direction E1 of the first linear extending portion 212 is perpendicular to the extending direction E2 of the second linear extending portion 213, and the extending direction E2 of the second linear extending portion 213 is perpendicular to the extending direction E3 of the third linear extending portion 214.

In some embodiments, as shown in FIG. 9, a minimum distance d4 between the orthographic projection of the first connection portion 215 on the substrate 1 and the fourth orthographic projection C4 is greater than or equal to 0.25 mm.

For example, the minimum distance d4 between the orthographic projection of the first connection portion 215 on the substrate 1 and the fourth orthographic projection C4 may be 0.25 mm, 0.27 mm, or 0.30 mm.

In this way, the stress concentration region is far away from the region where the first connection portion 215 is located, so that the peeling of the encapsulation portion and the chapping of the reflective layer are less likely to occur in the region where the first connection portion 215 is located when the ambient temperature changes, and the problem that the electronic device 4 in the backplane 10 cannot operate normally when the temperature changes is further solved. Therefore, the ability of the backplane 10 to resist the cold and hot shock is effectively improved, the use stability of the backplane 10 is enhanced, and the service life of the backplane 10 is prolonged.

In some other embodiments, as shown in FIG. 9, a minimum distance d5 between the orthographic projection of the second connection portion 216 on the substrate 1 and the fourth orthographic projection C4 is greater than or equal to 0.25 mm.

For example, the minimum distance d5 between the orthographic projection of the second connection portion 216 on the substrate 1 and the fourth orthographic projection C4 may be 0.25 mm, 0.27 mm, or 0.30 mm.

In this way, the stress concentration region is far away from the region where the second connection portion 216 is located, so that the peeling of the encapsulation portion and the chapping of the reflective layer are less likely to occur in the region where the second connection portion 216 is located when the ambient temperature changes, and the problem that the electronic device 4 in the backplane 10 cannot operate normally when the temperature changes is further solved. Therefore, the ability of the backplane 10 to resist the cold and hot shock is effectively improved, the use stability of the backplane 10 is enhanced, and the service life of the backplane 10 is prolonged.

In yet some other embodiments, as shown in FIG. 9, the minimum distance between the orthographic projection of the first connecting portion 215 on the substrate 1 and the fourth orthographic projection C4 is greater than or equal to 0.25 mm, and the minimum distance between the orthographic projection of the second connecting portion 216 on the substrate 1 and the fourth orthographic projection C4 is greater than or equal to 0.25 mm.

For example, the minimum distance d4 between the orthographic projection of the first connection portion 215 on the substrate 1 and the fourth orthographic projection C4 may be 0.25 mm, 0.27 mm, or 0.30 mm. For example, the minimum distance d5 between the orthographic projection of the second connection portion 216 on the substrate 1 and the fourth orthographic projection C4 may be 0.25 mm, 0.27 mm, or 0.30 mm.

In this way, the stress concentration region is far away from both the region where the first connection portion 215 is located and the region where the second connection portion 216 is located, so that when the ambient temperature changes, the peeling of the encapsulation portion and the chapping of the reflective layer are less likely to occur in the region where the first connection portion 215 is located and the region where the second connection portion 216 is located, and the problem that the electronic device 4 in the backplane 10 cannot operate normally when the temperature changes is further solved. Therefore, the ability of the backplane 10 to resist the cold and hot shock is effectively improved, the use stability of the backplane 10 is enhanced, and the service life of the backplane 10 is prolonged.

In some embodiments, as shown in FIGS. 4 and 9, the shape of the fourth orthographic projection C4 is a circle or substantially a circle. A radius of the circle is greater than or equal to 1.25 mm. Alternatively, a radius of the circle is less than or equal to 1.0 mm.

"substantially" is meant to include a stated shape and shapes that are similar to the stated shape in their entirety. For example, "substantially a circle" may be a circle, or a shape that is similar to a circle in its entirety. At least part of a border of the shape is allowed to be different from a border of the circle. That is, the at least part of the border of the shape is allowed to be non-curvilinear. For example, the at least part of the border of the shape may be jagged.

In a case where the shape of the fourth orthographic projection C4 is a substantially circle, a radius of the fourth orthographic projection C4 is a distance from a center of a circle corresponding to a curvilinear border to any point on a non-curvilinear border.

In some embodiments of the present disclosure, the shape of the fourth orthographic projection C4 is a circle or substantially a circle, so that in a case where the electronic device 4 is a light-emitting device 41, the encapsulation portion 5 may not only prevent the water vapor from entering the light-emitting device 41 to protect the light-emitting device 41 from corrosion or collision, but also converge light emitted from the light-emitting device 41, so as to improve a light extraction efficiency of the backplane 10.

In some embodiments of the present disclosure, the radius of the circle is greater than or equal to 1.25 mm, so that the fourth orthographic projection C4 has a large area, and the encapsulation portion 5 is easier to cover the regions respectively located on the two sides of the first linear extending portion 212 and the regions respectively located on the two sides of the second linear extending portion 213. In this way, when the ambient temperature changes, the shrinkage force of the encapsulation portion 5 is more likely to be offset by the film adhesion in the regions respectively located on the two sides of the first linear extending portion 212 and the regions respectively located on the two sides of the second linear extending portion 213, so that the peeling of the encapsulation portion, the chapping of the reflective layer, and the breakage of the linear extending portion are less likely to occur in the backplane 10. Thus, the problem that the electronic device 4 in the backplane 10 cannot operate normally due to a temperature change is solved, so that the ability of the backplane 10 to resist the cold and hot shock is improved, the use stability of the backplane 10 is enhanced, and the service life of the backplane 10 is prolonged.

In some embodiments of the present disclosure, the radius of the circle is less than or equal to 1.0 mm, so that the fourth orthographic projection C4 has a small area, and the edge of the encapsulation portion 5 is less likely to fall in the region where the third linear extending portion 214 is located. In this way, when the ambient temperature changes, the shrinkage force of the encapsulation portion 5 does not directly act on a region having weak film adhesion, so that the peeling of the encapsulation portion, the chapping of the reflective layer, and the breakage of the first conductive line are less likely to occur in the backplane 10. Thus, the problem that the electronic device 4 in the backplane 10 cannot operate normally due to a temperature change is solved, so that the ability of the backplane 10 to resist the cold and hot shock is improved, the use stability of the backplane 10 is enhanced, and the service life of the backplane 10 is prolonged.

In some embodiments, the line width of the first linear extending portion 212 is less than or equal to 0.2 mm. The line width of the second linear extending portion 213 is less than or equal to 0.2 mm. The line width of the third linear extending portion 214 is less than or equal to 0.2 mm.

For example, the line width of the first linear extending portion 212 may be 0.2 mm, 0.18 mm, or 0.16 mm.

For example, the line width of the second linear extending portion 213 may be 0.2 mm, 0.18 mm, or 0.16 mm.

For example, the line width of the third linear extending portion 214 may be 0.2 mm, 0.18 mm, or 0.16 mm.

The line widths of the first linear extending portion 212, the second linear extending portion 213 and the third linear extending portion 214 may be equal or unequal.

In this way, a region corresponding to the first conductive line 211 in the backplane 10 has a small area, and the region having weak film adhesion in the backplane 10 has a small area, so that a probability that the stress concentration region is overlapped with the region having weak film adhesion is reduced. Thus, when the ambient temperature changes, the peeling of the encapsulation portion, the chapping of the reflective layer, and the breakage of the first conductive line are less likely to occur in the backplane 10, so that the problem that the electronic device 4 in the backplane 10 cannot operate normally due to a temperature change is solved. Therefore, the ability of the backplane 10 to resist the cold and hot shock is improved, the use stability of the backplane 10 is enhanced, and the service life of the backplane 10 is prolonged.

Figure 10:
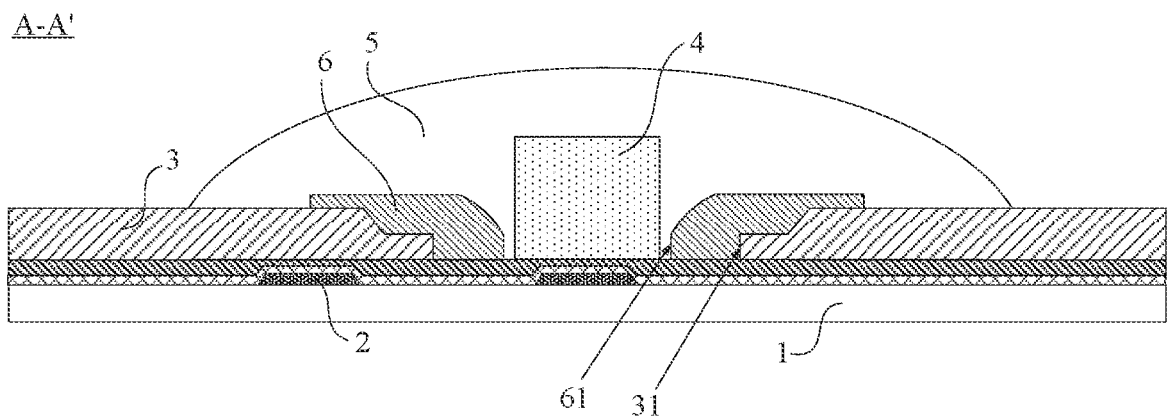
FIG. 10 is yet another sectional view of the backplane in FIG. 1 taken along the A-A' direction, in accordance with some embodiments.

In some embodiments, as shown in FIG. 10, the backplate 10 further includes a plurality of reflective portions 6. Each reflective portion 6 covers an edge of a first through hole 31, and the reflective portion 6 defines a second through hole 61 in the first through hole 31. The electronic device 4 is located in the second through hole 61. In this way, when light reaches a region between the electronic device 4 and the edge of the first through hole 31, the reflective portion 6 is able to reflect the light, thereby improving a light extraction rate of the backplane 10.

Figure 11:
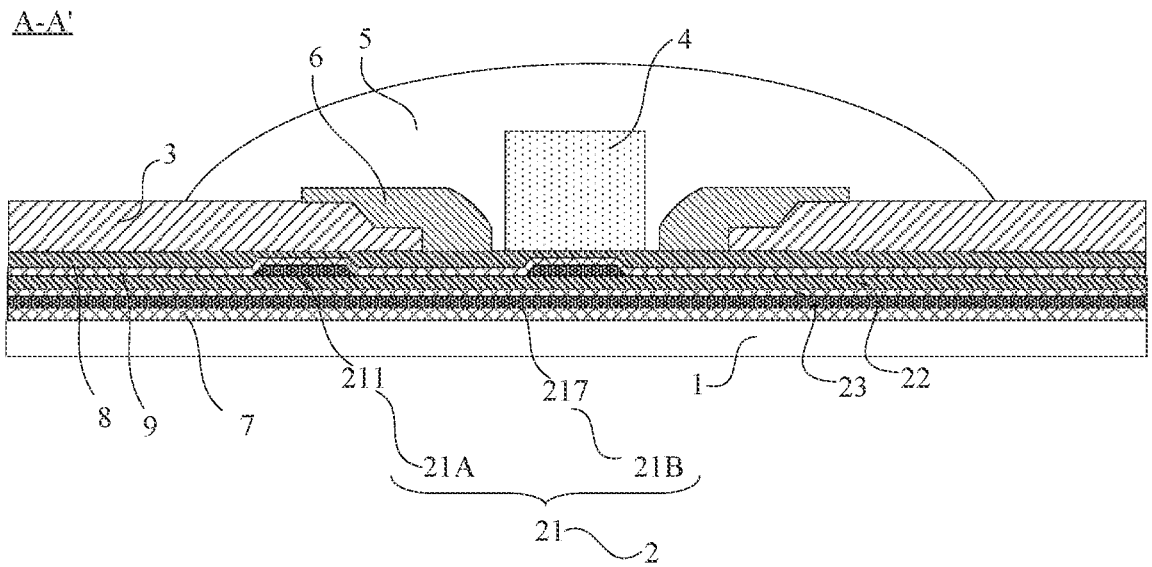
FIG. 11 is yet another sectional view of the backplane in FIG. 1 taken along the A-A' direction, in accordance with some embodiments.

As shown in FIGS. 10 and 11, each reflective portion 6 covers an edge of a first through hole 31, which may be that, for example, the reflective portion 6 covers a portion, close to the first through hole 31, of a surface of the reflective layer 3 away from the substrate 1, and the reflective portion 6 further covers a portion, close to the reflective layer 3, of a surface of a second insulating layer 8 exposed by the first through hole 31. For example, the reflective portion 6 may be made of white silica gel.

In some embodiments, as shown in FIG. 11, the circuit structure layer 2 includes two conductive layers 21. A conductive layer 21 in the two conductive layers 21 away from the substrate 1 is a first conductive layer 21A, and another conductive layer 21 in the two conductive layers 21 proximate to the substrate 1 is a second conductive layer 21B. The second conductive layer 21B includes a plurality of second conductive lines 217. The circuit structure layer 2 further includes a first insulating layer 22 located between the first conductive layer 21A and the second conductive layer 21B and a first transition layer 23 located between the second conductive layer 21B and the first insulating layer 22.

The first insulating layer 22 may be made of an organic insulating material. The first transition layer 23 may be made of an inorganic insulating material, such as silicon nitride.

In some embodiments of the present disclosure, the first transition layer 23 is disposed between the first insulating layer 22 and the second conductive layer 21B, so that a region corresponding to the second conductive layer 21B in the backplane 10 may have enhanced film adhesion.

In some embodiments of the present disclosure, the first conductive lines 211 are disposed in the first conductive layer 21A, and the second conductive lines 217 are disposed in the second conductive layer 21B, so that an arrangement of the first conductive lines 211 and an arrangement of the second conductive lines 217 are simple, thereby reducing a difficulty of wiring in the backplane 10, saving cost, and improving the manufacturing efficiency of the backplane 10.

In some embodiments, as shown in FIG. 11, the backplane 10 further includes a second transition layer 7, the second insulating layer 8 and a third transition layer 9. The second transition layer 7 is located between the substrate 1 and the second conductive layer 21B. The second insulating layer 8 is located between the first conductive layer 21A and the reflective layer 3. The third transition layer 9 is located between the first conductive layer 21A and the second insulating layer 8.

For example, the second transition layer 7 and the third transition layer 9 each may be made of an inorganic insulating material, such as silicon nitride. The second insulating layer 8 may be made of an organic insulating material.

In some embodiments of the present disclosure, the second transition layer 7 and the third transition layer 9 are disposed, so that the region corresponding to the first conductive line 211 in the backplane 10 is able to have enhanced film adhesion.

Figure 12:
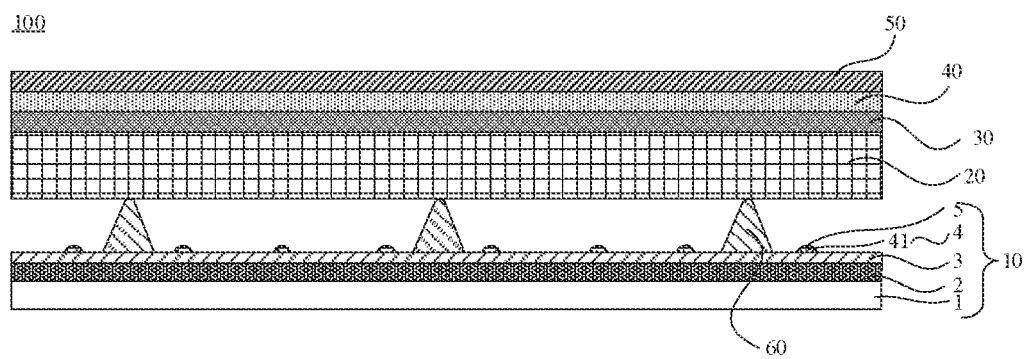
FIG. 12 is a structural diagram of a backlight module, in accordance with some embodiments.

As shown in FIG. 12, some embodiments of the present disclosure further provide a backlight module 100, and the backlight module 100 includes the backplane 10 in any one of the above embodiments. The plurality of electronic devices in the backplane 10 include a plurality of light-emitting devices 41.

Beneficial effects that may be achieved by the backlight module 100 in some embodiments of the present disclosure are the same as the beneficial effects that may be achieved by the backplane 10 in some embodiments of the present disclosure, and will not be repeated here.

In some embodiments, as shown in FIG. 12, the backlight module 100 further includes a diffusion plate 20, a quantum dot film 30, a diffusion sheet 40, a composite film 50, and a plurality of support pillars 60. The diffusion plate 20 is located on a light-emitting side of the backplane 10. The quantum dot film 30 is located on a side of the diffusion plate 20 away from the backplane 10. The diffusion sheet 40 is located on a side of the quantum dot film 30 away from the diffusion plate 20. The composite film 50 is located on a side of the diffusion sheet 40 away from the quantum dot film 30. The plurality of support pillars 60 are located between the backplane 10 and the diffuser plate 20.

The diffusion plate 20 and the diffusion sheet 40 are used for reducing light shadows generated by the backplane 10, so as to improve a light-emitting effect of the backlight module 100. The quantum dot film 30 may convert blue light into white light due to an excitation of the blue light emitted from the backplane 10, so as to improve a utilization rate of light. The composite film 50 may be used for increasing a brightness of the light emitted from the backplane 10. The support pillars 60 are used for supporting a plurality of films such as the diffusion plate 20, the quantum dot film 30, the diffusion sheet 40 and the composite film 50, so as to obtain a certain light-mixing distance and eliminate the light shadows. For example, the light-mixing distance may be in a range of 1 mm to 10 mm, inclusive.

For example, as shown in FIG. 12, the support pillars 60 may be located on the surface of the reflective layer 3 away from the substrate 1. Alternatively, for example, the support pillar 60 may be located in the first through hole 31 of the reflective layer 3. For example, the support pillar 60 may be made of polycarbonate (PC).

Figure 13A:
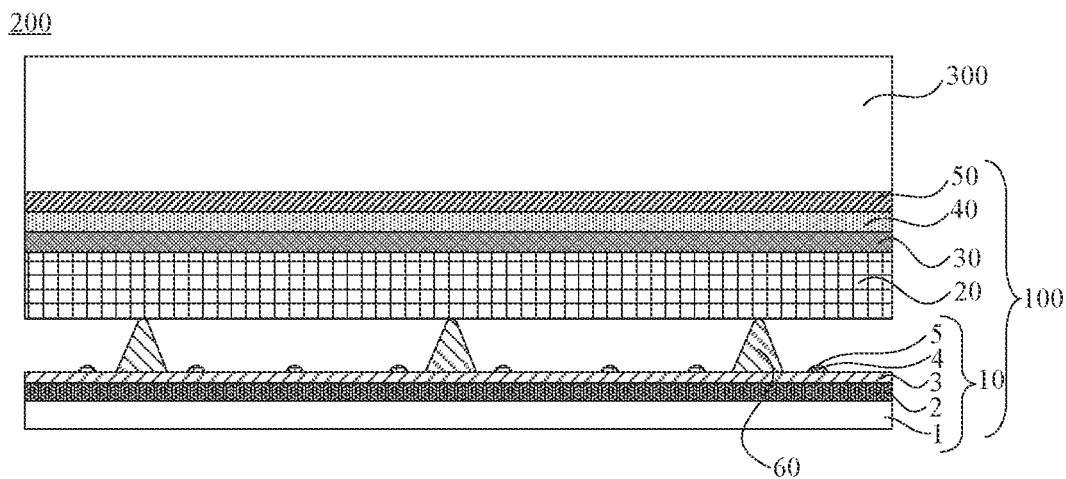
FIG. 13A is a structural diagram of a display apparatus, in accordance with some embodiments.

As shown in FIG. 13A, some embodiments of the present disclosure provide a display apparatus 200. The display apparatus 200 includes the backlight module 100 in any one of the above embodiments and a liquid crystal display panel 300 located on a light exit side of the backlight module 100.

For example, the display apparatus 200 may be any component with a display function, such as a television, a digital camera, a mobile phone, a watch, a tablet computer, a notebook computer, or a navigator.

Beneficial effects that may be achieved by the display apparatus 200 in some embodiments of the present disclosure are the same as the beneficial effects that may be achieved by the backlight module 100 in some embodiments of the present disclosure, and will not be repeated here.

Figure 13B:
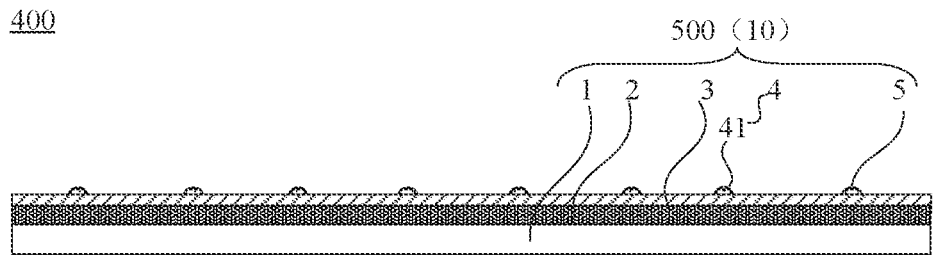
FIG. 13B is a structural diagram of another display apparatus, in accordance with some embodiments.

As shown in FIG. 13B, some embodiments of the present disclosure further provide another display apparatus 400. The display apparatus includes a display substrate 500, and the display substrate 500 is the backplane 10 in any one of the above embodiments. The plurality of electronic devices 4 in the backplane 10 include a plurality of light-emitting devices 41.

Figure 14:
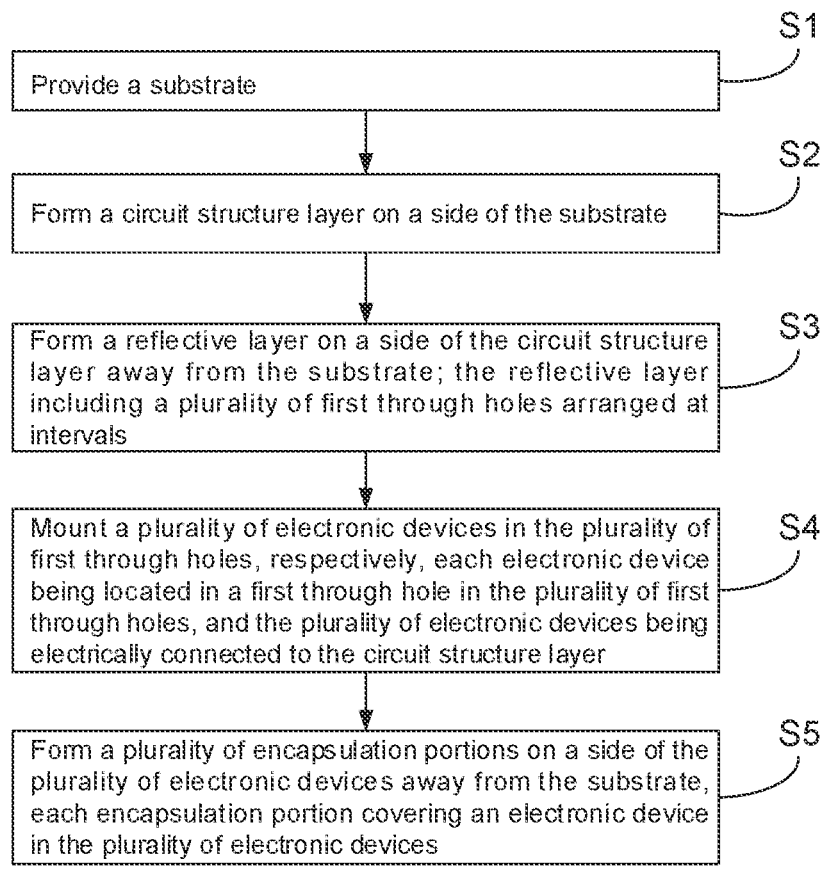
FIG. 14 is a flow diagram of a method for manufacturing a backplane, in accordance with some embodiments.

As shown in FIG. 14, some embodiments of the present disclosure provide a method for manufacturing a backplane 10. The method includes S1 to S5.

In S1, a substrate 1 is provided.

In S2, a circuit structure layer 2 is formed on a side of the substrate 1.

In S3, a reflective layer 3 is formed on a side of the circuit structure layer 2 away from the substrate 1. The reflective layer 3 includes a plurality of first through holes 31 arranged at intervals.

In S4, a plurality of electronic devices 4 are mounted in the plurality of first through holes 31, respectively. Each electronic device 4 is located in a first through hole 31, and the plurality of electronic devices 4 are all electrically connected to the circuit structure layer 2.

In S5, a plurality of encapsulation portions 5 are formed on a side of the plurality of electronic devices 4 away from the substrate 1. Each encapsulation portion 5 covers an electronic device 4.

A conductive layer 21 in the circuit structure layer 2 farthest from the substrate 1 includes a plurality of first conductive lines 211. At least one first conductive line 211 includes a first linear extending portion 212, a second linear extending portion 213 and a third linear extending portion 214 that are sequentially connected. An orthographic projection of the first linear extending portion 212 on the substrate 1 is a first orthographic projection C1, an orthographic projection of the second linear extending portion 213 on the substrate 1 is a second orthographic projection C2, an orthographic projection of the third linear extending portion 214 on the substrate 1 is a third orthographic projection C3, and an orthographic projection of the encapsulation portion 5 on the substrate 1 is a fourth orthographic projection C4.

The first orthographic projection C1 is located within the fourth orthographic projection C4, the second orthographic projection C2 is partially overlapped with the fourth orthographic projection C4, and the third orthographic projection C3 is located outside the fourth orthographic projection C4.

Two endpoints of the fourth orthographic projection C4 that are farthest from each other in a width direction Y of the second linear extending portion 213 are first endpoints Q. A distance d1 between the second orthographic projection C2 and each of first reference lines M, which respectively pass through the first endpoints Q and are parallel to the second linear extending portion 213, is not less than half of a line width of the second linear extending portion 213.

In the backplane 10 manufactured by the above manufacturing method, an orthographic projection of an edge of the encapsulation portion 5 on the substrate 1 is non-overlapped with the orthographic projection of the first linear extending portion 212 on the substrate 1 and the orthographic projection of the third linear extending portion 214 on the substrate 1. Therefore, in a region where the first linear extension part 212 is located and a region where the third linear extension part 214 is located, peeling of the encapsulation portion and chapping of the reflective layer are avoided, and a problem that the electronic device 4 in the backplane 10 cannot operate normally due to breakage of the first conductive line 211 is solved. Therefore, an ability of the backplane 10 to resist cold and hot shock is effectively improved, a use stability of the backplane 10 is enhanced, and a service life of the backplane 10 is prolonged.

Moreover, since the encapsulation portion 5 covers not only a partial region where the second linear extending portion 213 is located, but also partial regions respectively located on two sides of the second linear extending portion 213 in the width direction Y of the second linear extending portion 213, when the ambient temperature changes, a stress concentration region occurring at a position corresponding to the edge of the encapsulation portion 5 in the backplane 10 is overlapped with a region having strong film adhesion, and the film adhesion is able to be offset with a shrinkage force of the encapsulation portion 5. Therefore, the risks of the peeling of the encapsulation portion 5, the chapping of the reflective layer, and breakage of the second linear extending portion 213 are effectively reduced, so that the problem that the electronic device 4 in the backplane 10 cannot operate normally due to the breakage of the first conductive line 211 may be further solved. Therefore, the ability of the backplane 10 to resist the cold and hot shock is effectively improved, the use stability of the backplane 10 is enhanced, and the service life of the backplane 10 is prolonged.

Figure 15:
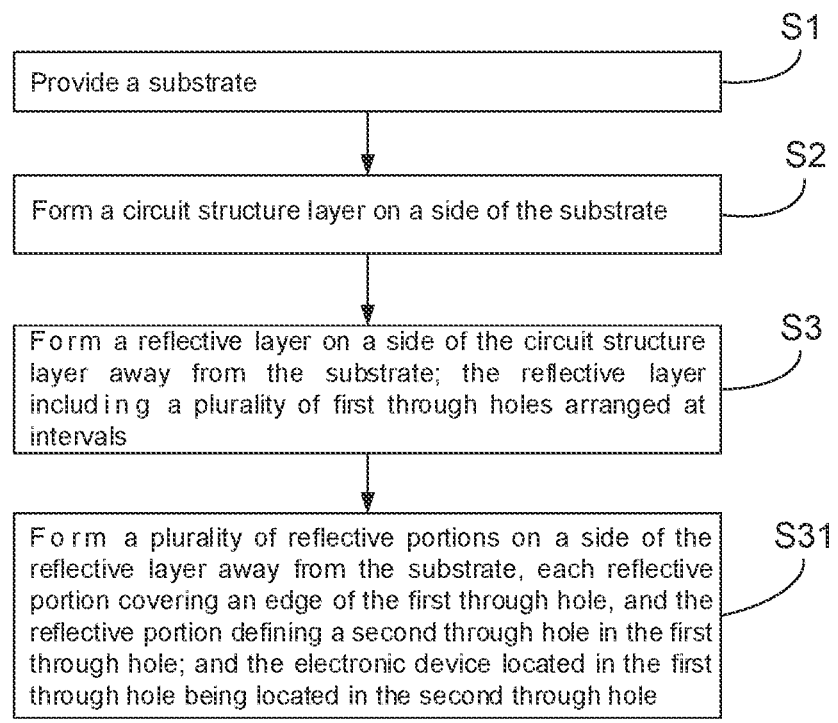
FIG. 15 is a flow diagram of another method for manufacturing a backplane, in accordance with some embodiments.

In some embodiments, as shown in FIG. 15, after the reflective layer 3 is formed on the side of the circuit structure layer 2 away from the substrate 1 (i.e., after S3), the method for manufacturing the backplane 10 further includes S31.

In S31, a plurality of reflective portions 6 are formed on a side of the reflective layer 3 away from the substrate 1. Each reflective portion 6 covers an edge of a first through hole 31, and the reflective portion 6 defines a second through hole 61 in the first through hole 31. The electronic device 4 is located in the second through hole 61.

In this way, when light reaches a region between the electronic device 4 and the edge of the first through hole 31, the reflective portion 6 is able to reflect the light, thereby improving a light extraction rate of the backplane 10.

Figure 16:
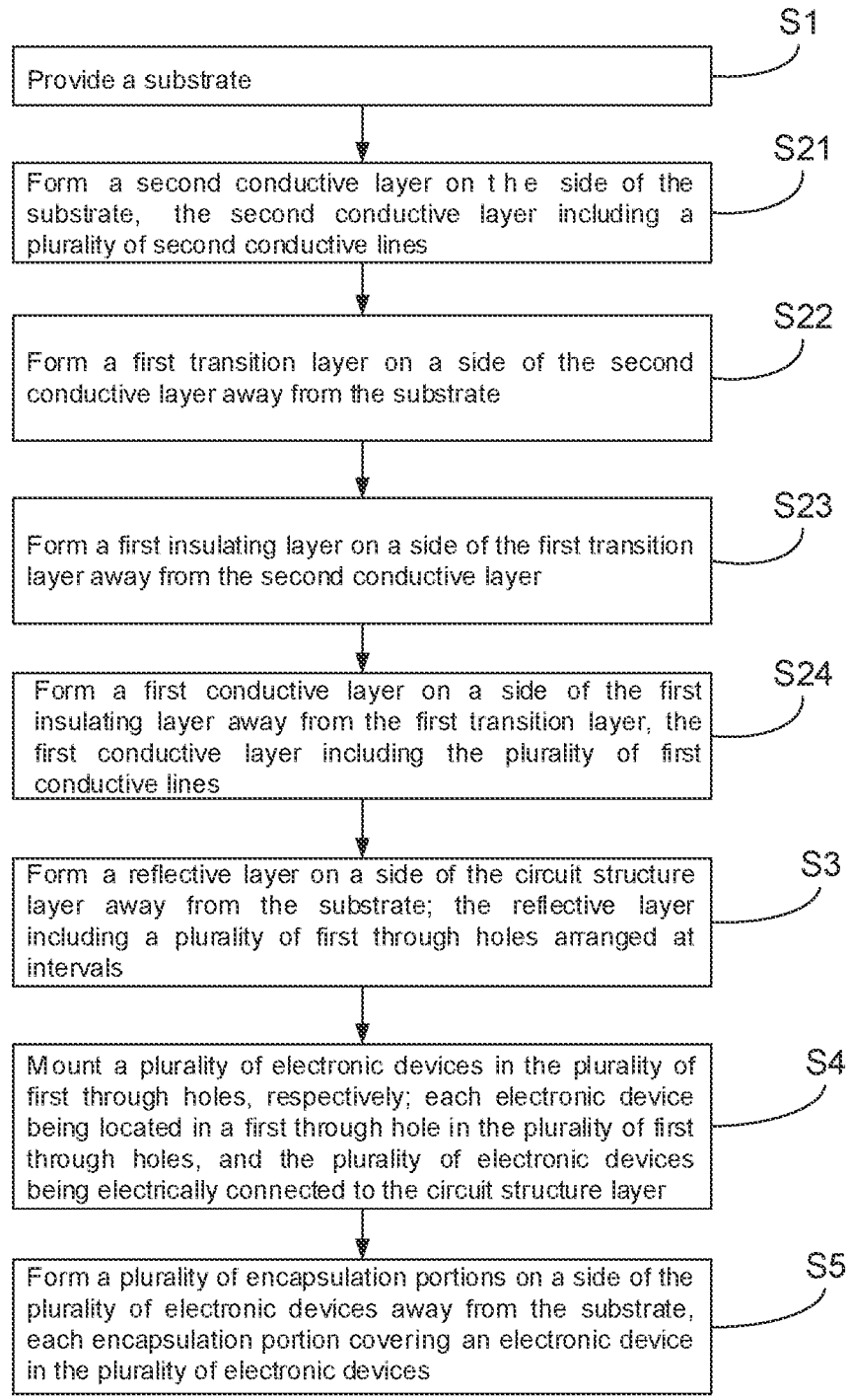
FIG. 16 is a flow diagram of yet another method for manufacturing a backplane, in accordance with some embodiments.

In some embodiments, as shown in FIG. 16, forming the circuit structure layer 2 on the side of the substrate 1 (i.e., S2) includes S21 to S24.

In S21, a second conductive layer 21B is formed on the side of the substrate 1. The second conductive layer 21B includes a plurality of second conductive lines 217.

In S22, a first transition layer 23 is formed on a side of the second conductive layer 21B away from the substrate 1.

In S23, a first insulating layer 22 is formed on a side of the first transition layer 23 away from the second conductive layer 21B.

In S24, a first conductive layer 21A is formed on a side of the first insulating layer 22 away from the first transition layer 23.

Figure 17:
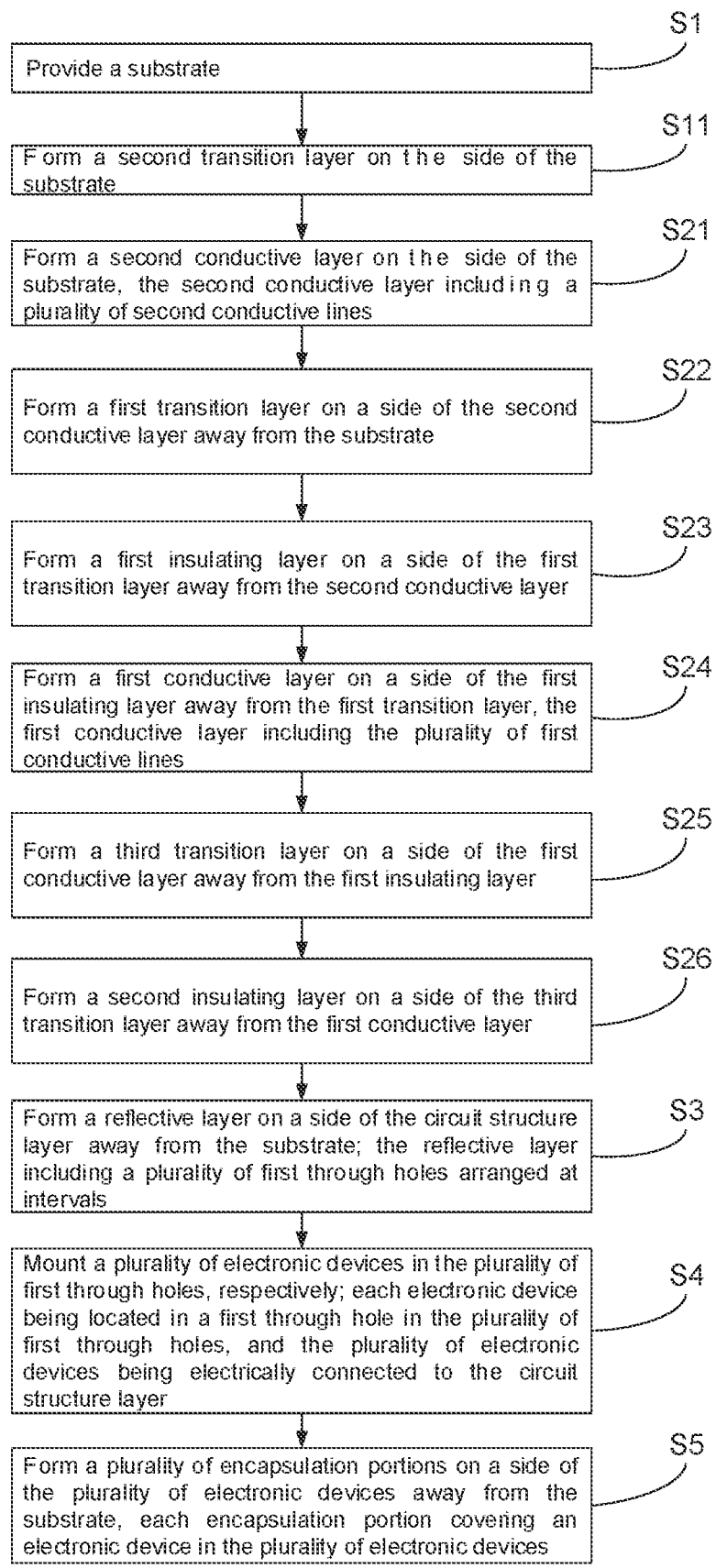
FIG. 17 is a flow diagram of yet another method for manufacturing a backplane, in accordance with some embodiments.

In some embodiments, as shown in FIG. 17, before the second conductive layer 21B is formed on the side of the substrate 1 (i.e., before S21), the method for manufacturing a backplane 10 further includes S11.

In S11, a second transition layer 7 is formed on the side of the substrate 1.

In some embodiments, as shown in FIG. 17, before the reflective layer 3 is formed on the side of the circuit structure layer 2 away from the substrate 1 (i.e., before S3), the method for manufacturing the backplane further includes S25 and S26.

In S25, a third transition layer 9 is formed on a side of the first conductive layer 21A away from the first insulating layer 22.

In S26, a second insulating layer 8 is formed on a side of the third transition layer 9 away from the first conductive layer 21A.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A backplane, comprising:
   a substrate;
   a circuit structure layer located on a side of the substrate;
   a reflective layer located on a side of the circuit structure layer away from the substrate, the reflective layer including a plurality of first through holes arranged at intervals;
   a plurality of electronic devices, each electronic device being located in a first through hole in the plurality of first through holes, and the plurality of electronic devices being electrically connected to the circuit structure layer; and
   a plurality of encapsulation portions, each encapsulation portion covering an electronic device in the plurality of electronic devices;
   wherein a conductive layer in the circuit structure layer farthest from the substrate includes a plurality of first conductive lines, and at least one first conductive line includes a first linear extending portion, a second linear extending portion and a third linear extending portion that are sequentially connected; an orthographic projection of the first linear extending portion on the substrate is a first orthographic projection, an orthographic projection of the second linear extending portion on the substrate is a second orthographic projection, an orthographic projection of the third linear extending portion on the substrate is a third orthographic projection, and an orthographic projection of an encapsulation portion in the plurality of encapsulation portions on the substrate is a fourth orthographic projection;
   the first orthographic projection is located within the fourth orthographic projection, the second orthographic projection is partially overlapped with the fourth orthographic projection, and the third orthographic projection is located outside the fourth orthographic projection;
   two endpoints of the fourth orthographic projection that are farthest from each other in a width direction of the second linear extending portion are first endpoints; and
   a distance between the second orthographic projection and each of first reference lines, which respectively pass through the first endpoints and are parallel to the second linear extending portion, is not less than half of a line width of the second linear extending portion.

2. The backplane according to claim 1, wherein the distance between the second orthographic projection and each of the first reference lines, which respectively pass through the first endpoints and are parallel to the second linear extending portion, is greater than or equal to 0.15 mm.

3. The backplane according to claim 1, wherein two endpoints of the fourth orthographic projection that are farthest from each other in a width direction of the first linear extending portion are second endpoints; and
   a distance between the first orthographic projection and each of second reference lines, which respectively pass through the second endpoints and are parallel to the first linear extending portion, is not less than half of a line width of the first linear extending portion; or the distance between the first orthographic projection and each of the second reference lines, which respectively pass through the second endpoints and are parallel to the first linear extending portion, is not less than half of the line width of the first linear extending portion and greater than or equal to 0.15 mm.

4. The backplane according to claim 1, wherein a minimum distance between the third orthographic projection and the fourth orthographic projection is not less than half of a line width of the third linear extending portion; or the minimum distance between the third orthographic projection and the fourth orthographic projection is not less than half of the line width of the third linear extending portion and greater than or equal to 0.15 mm.

5. The backplane according to claim 1, wherein
the at least one first conductive line further includes a first connection portion connecting the first linear extending portion and the second linear extending portion, and a second connection portion connecting the second linear extending portion and the third linear extending portion; and
an orthographic projection of the first connection portion on the substrate is located within the fourth orthographic projection, and an orthographic projection of the second connection portion on the substrate is located outside the fourth orthographic projection.

6. The backplane according to claim 5, wherein
a minimum distance between the orthographic projection of the first connection portion on the substrate and the fourth orthographic projection is greater than or equal to 0.25 mm; and/or
a minimum distance between the orthographic projection of the second connection portion on the substrate and the fourth orthographic projection is greater than or equal to 0.25 mm.

7. The backplane according to claim 1, wherein a shape of the fourth orthographic projection is a circle or substantially a circle; wherein
a radius of the circle is greater than or equal to 1.25 mm, or is less than or equal to 1.0 mm.

8. The backplane according to claim 1, wherein a line width of the first linear extending portion is less than or equal to 0.2 mm;
the line width of the second linear extending portion is less than or equal to 0.2 mm; and
a line width of the third linear extending portion is less than or equal to 0.2 mm; and/or
an extending direction of the first linear extending portion is perpendicular to an extending direction of the second linear extending portion; and/or the extending direction of the second linear extending portion is perpendicular to an extending direction of the third linear extending portion.

9. The backplane according to claim 1, further comprising:
a plurality of reflective portions, each reflective portion covering an edge of the first through hole, and the reflective portion defining a second through hole in the first through hole; and the electronic device located in the first through hole being located in the second through hole.

10. The backplane according to claim 1, wherein the plurality of electronic devices include at least one light-emitting device and at least one driver chip.

11. The backplane according to claim 1, wherein the circuit structure layer includes two conductive layers, a conductive layer in the two conductive layers away from the substrate is a first conductive layer, and another conductive layer in the two conductive layers proximate to the substrate is a second conductive layer; the first conductive layer includes the plurality of first conductive lines, and the second conductive layer includes a plurality of second conductive lines; and
the circuit structure layer further includes:
a first insulating layer located between the first conductive layer and the second conductive layer; and
a first transition layer located between the second conductive layer and the first insulating layer.

12. The backplane according to claim 11, further comprising:
a second transition layer located between the substrate and the second conductive layer;
a second insulating layer located between the first conductive layer and the reflective layer; and
a third transition layer located between the first conductive layer and the second insulating layer.

13. A backlight module, comprising:
the backplane according to claim 1, the plurality of electronic devices in the backplane include a plurality of light-emitting devices.

14. The backlight module according to claim 13, further comprising:
a diffusion plate located on a light-emitting side of the backplane;
a quantum dot film located on a side of the diffusion plate away from the backplane;
a diffusion sheet located on a side of the quantum dot film away from the diffusion plate;
a composite film located on a side of the diffusion sheet away from the quantum dot film; and
a plurality of support pillars located between the backplane and the diffusion plate.

15. A display apparatus, comprising:
the backlight module according to claim 13; and
a liquid crystal display panel located on a light exit side of the backlight module.

16. A display apparatus, comprising:
a display substrate, wherein the display substrate is the backplane according to claim 1, and the plurality of electronic devices in the backplane include a plurality of light-emitting devices.

17. A method for manufacturing a backplane, comprising:
providing a substrate;
forming a circuit structure layer on a side of the substrate;
forming a reflective layer on a side of the circuit structure layer away from the substrate; the reflective layer including a plurality of first through holes arranged at intervals;
mounting a plurality of electronic devices in the plurality of first through holes, respectively; each electronic device being located in a first through hole in the plurality of first through holes, and the plurality of electronic devices being electrically connected to the circuit structure layer; and
forming a plurality of encapsulation portions on a side of the plurality of electronic devices away from the substrate, each encapsulation portion covering an electronic device in the plurality of electronic devices;
wherein a conductive layer in the circuit structure layer farthest from the substrate includes a plurality of first conductive lines, and at least one first conductive line includes a first linear extending portion, a second linear extending portion and a third linear extending portion that are sequentially connected; an orthographic projection of the first linear extending portion on the substrate is a first orthographic projection, an orthographic projection of the second linear extending portion on the substrate is a second orthographic projection, an orthographic projection of the third linear extending portion on the substrate is a third orthographic projection, and an orthographic projection of an encapsulation portion in the plurality portions on the substrate is a fourth orthographic projection;

the first orthographic projection is located within the fourth orthographic projection, the second orthographic projection is partially overlapped with the fourth orthographic projection, and the third orthographic projection is located outside the fourth orthographic projection;

two endpoints of the fourth orthographic projection that are farthest from each other in a width direction of the second linear extending portion are first endpoints; and a distance between the second orthographic projection and each of first reference lines, which respectively pass through the first endpoints and are parallel to the second linear extending portion, is not less than half of a line width of the second linear extending portion.

18. The method for manufacturing the backplane according to claim 17, wherein after forming the reflective layer on the side of the circuit structure layer away from the substrate, the method for manufacturing the backplane further comprises:

forming a plurality of reflective portions on a side of the reflective layer away from the substrate, each reflective portion covering an edge of the first through hole, and the reflective portion defining a second through hole in the first through hole; and the electronic device located in the first through hole being located in the second through hole.

19. The method for manufacturing the backplane according to claim 17, wherein forming the circuit structure layer on the side of the substrate, includes:

forming a second conductive layer on the side of the substrate, the second conductive layer including a plurality of second conductive lines;

forming a first transition layer on a side of the second conductive layer away from the substrate;

forming a first insulating layer on a side of the first transition layer away from the second conductive layer; and forming a first conductive layer on a side of the first insulating layer away from the first transition layer, the first conductive layer including the plurality of first conductive lines.

20. The method for manufacturing the backplane according to claim 19, wherein before forming the second conductive layer on the side of the substrate, the method for manufacturing the backplane further comprises:

forming a second transition layer on the side of the substrate; and before forming the reflective layer on the side of the circuit structure layer away from the substrate, the method for manufacturing the backplane further comprises:

forming a third transition layer on a side of the first conductive layer away from the first insulating layer; and forming a second insulating layer on a side of the third transition layer away from the first conductive layer.

* * * * *